United States Patent [19]

Suzuki et al.

[11] Patent Number: 5,063,421
[45] Date of Patent: Nov. 5, 1991

[54] SILICON CARBIDE LIGHT EMITTING DIODE HAVING A PN JUNCTION

[75] Inventors: Akira Suzuki, Nara; Katsuki Furukawa, Sakai; Mitsuhiro Shigeta, Joyo; Yoshihisa Fujii, Nara, all of Japan

[73] Assignee: Sharp Kabushiki Kaisha, Japan

[21] Appl. No.: 390,600

[22] Filed: Aug. 7, 1989

[30] Foreign Application Priority Data

Aug. 8, 1988 [JP] Japan .................. 63-197500

[51] Int. Cl.$^5$ ............................................. H01L 33/00
[52] U.S. Cl. ...................................... 357/17; 357/4; 357/6
[58] Field of Search .................. 357/17, 4, 6

[56] References Cited

U.S. PATENT DOCUMENTS

| | | |
|---|---|---|
| 3,517,281 | 6/1970 | Mlavsky et al. |
| 3,975,661 | 8/1976 | Kanatani et al. ........... 357/17 |
| 4,152,711 | 5/1979 | Nakata ...................... 357/17 |
| 4,613,546 | 9/1986 | Kuwata et al. ............. 357/54 |
| 4,613,793 | 9/1986 | Panicker et al. ........... 357/6 |
| 4,736,229 | 4/1988 | Holmberg et al. ......... 357/4 |

OTHER PUBLICATIONS

*J. Appl. Phys.*, 53 (10), Oct. 1982, pp. 6962-6967.
*J. Appl. Phys.*, vol. 50(12), Dec. 1979, pp. 8215-8225, Hoffmann et al.
*Elektor*, Mar. 1982, pp. 3-36 through 3-41.

*Primary Examiner*—Eugene R. LaRoche
*Assistant Examiner*—R. Ratliff
*Attorney, Agent, or Firm*—Irell & Manella

[57] ABSTRACT

A silicon carbide light emitting diode having a pn junction is disclosed which comprises a semiconductor substrate, a first silicon carbide single-crystal layer of one conductivity formed on the substrate, and a second silicon carbide single-crystal layer of the opposite conductivity formed on the first silicon carbide layer, the first and second silicon carbide layers constituting the pn junction, wherein at least one of the first and second silicon carbide layers contains a tetravalent transition element as a luminescent center.

3 Claims, 2 Drawing Sheets

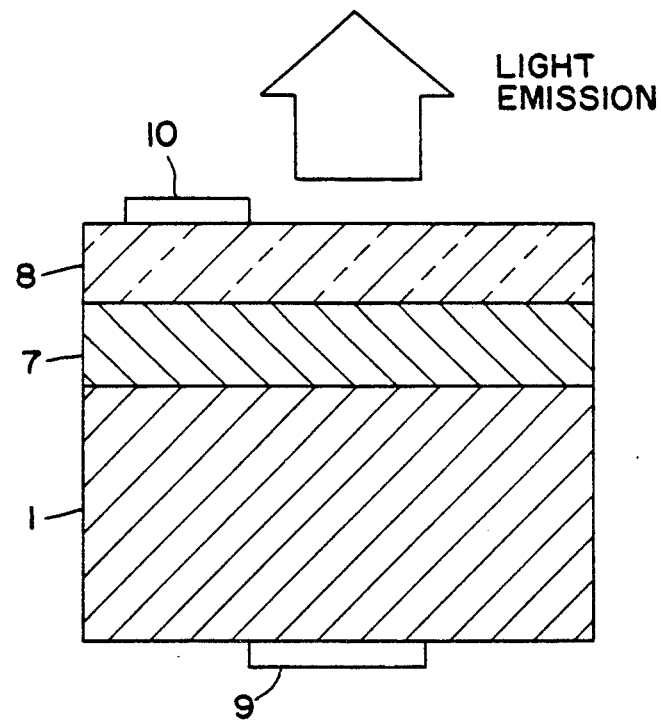

SILICON CARBIDE LIGHT EMITTING DIODE HAVING A PN JUNCTION

BACKGROUND OF THE INVENTION

1. Field of the invention

This invention relates to a silicon carbide light emitting diode having a pn junction, and more particularly, it relates to a silicon carbide light emitting diode having a pn junction, which can emit visible light of a shorter wavelength corresponding to a color in the range of from green to purple.

2. Description of the prior art

Since light emitting diodes are a small luminescent source which dissipate a significantly little amount of power, and can provide a stable light emission of high brightness, they are widely used as a display element in a variety of display units. They are also used as a light source for reading information records in a variety of information processing units. Although light emitting diodes capable of emitting light of a color in the range of from red to green have been put to practical use, light emitting diodes capable of emitting visible light of a shorter wavelength corresponding to a color in the range of from blue to purple have not yet attained a performance sufficient for practical use.

The color of light emitted from a light emitting diode depends on the semiconductor material used therefor. Semiconductor materials which can be used for blue light emitting diodes are limited to silicon carbide (SiC) which is a IV-IV group compound semiconductor, gallium nitride (GaN) which is a III-V group compound semiconductor, and zinc sulphide (ZnS) or zinc selenide (ZnSe) which are II-VI group compound semiconductors. With these semiconductor materials, extensive research and development for blue light emitting diodes has been made, but mass production of blue light emitting diodes with a brightness and stability sufficient for practical use has not yet been realized.

For the structure of light emitting diodes, a pn junction structure is most suited because electrons and holes as carriers can be injected in a light emitting region with high efficiency. However, among the above-mentioned semiconductor materials for blue light emitting diodes, each of the GaN, ZnS, and ZnSe semiconductors cannot be used for pn junction light emitting diodes since it is difficult to obtain p-type crystals, or, even if these crystals are obtained, they have high resistance and are very unstable. Therefore, a metal-insulating layer-semiconductor (MIS) structure using a thin insulating layer has been employed instead of a pn junction structure. Light emitting diodes with such an MIS structure have the disadvantages of having uneven device characteristics and of providing unstable light emission.

On the other hand, silicon carbide can be used for pn junction light emitting diodes since both p-type crystals and n-type crystals can readily be obtained. Moreover, they have the advantage that a growth method suitable for mass production, such as a liquid epitaxial growth (LPE) method, chemical vapor deposition (CVD) method, or the like, can be used in producing such a pn junction light emitting diode. Many reports have already been made on silicon carbide blue light emitting diodes with aluminum (Al) used as a luminescent center (see, e.g., M. Ikeda, T. Hayakawa, S. Yamagiwa, H. Matsunami, and T. Tanaka, Journal of Applied Physics, Vol. 50, No. 12, pp. 8215-8225, 1979; L. Hoffmann, G. Ziegler, D. Theis, and C. Weyrich, ibid., Vol. 53, No. 10, pp. 6962-6967, 1982).

FIG. 3 shows a conventional silicon carbide light emitting diode having a pn junction. The silicon carbide light emitting diode has a structure in which a n-type SiC single-crystal thin layer 7 and a p-type SiC single-crystal thin layer 8, both of which constitute the pn junction, are successively formed on an n-type SiC single-crystal substrate 1. Moreover, an ohmic electrode 9 for n-type SiC and an ohmic electrode 10 for p-type SiC are formed on the n-type SiC single-crystal substrate 1 and the p-type SiC single-crystal thin layer 8, respectively. In this light emitting diode, nitrogen (N) donors are used as dopants for generating carriers in the n-type SiC single-crystal thin layer 7, and aluminum (Al) acceptors are used as dopants for generating carriers in the p-type SiC single-crystal thin layer 8. As the dopants for generating carriers, gallium (Ga) acceptors or boron (B) acceptors may also be used. The n-type SiC single-crystal thin layer 7 contains Al as a luminescent center for the blue color.

Such a pn junction light emitting diode further contains an appropriate amount of Al acceptors in the n-type SiC single-crystal layer 7, and utilizes light emission by the radiative recombination between electrons trapped by the N donors and holes trapped by the Al acceptors, or by the radiative recombination between electrons in the conduction band and holes trapped by the Al acceptors, in the region of the n-type layer in the vicinity of the pn junction. That is, the Al acceptors are used both as the dopants for generating hole carriers and as the luminescent center. For this reason, it is not possible to control either a carrier concentration or a luminescent process in the p-type layer and the n-type layer independently of each other, thereby making it difficult to improve luminous efficiency. Moreover, electrons or holes cannot be sufficiently trapped by the N donors and the Al acceptors since the energy levels of the N donors and the Al acceptors are not fully away from the conduction band and the valence band, respectively. Therefore, the conventional silicon carbide light emitting diode has the disadvantage in that high luminous efficiency cannot be obtained.

SUMMARY OF THE INVENTION

The silicon carbide light emitting diode having a pn junction of this invention, which overcomes the above-discussed and numerous other disadvantages and deficiencies of the prior art, comprises a semiconductor substrate, a first silicon carbide single-crystal layer of one conductivity formed on said substrate, and a second silicon carbide single-crystal layer of the opposite conductivity formed on said first silicon carbide layer, said first and second silicon carbide layers constituting the pn junction, wherein at least one of said first and second silicon carbide layers contains a tetravalent transition element as a luminescent center.

In a preferred embodiment, the tetravalent transition element is at least one selected from the group consisting of titanium (Ti), zirconium (Zr), and hafnium (Hf).

In a preferred embodiment, the amount of said tetravalent transition element is in the range of $1 \times 10^{15}$ to $1 \times 10^{19} cm^{-3}$.

Thus, the invention described herein makes possible the objectives of (1) providing a silicon carbide light emitting diode having a pn junction, in which silicon carbide single-crystal layers constituting the pn junction contains a tetravalent transition element, so that visible light emission of a shorter wavelength corresponding to a color in the range of green to purple can be obtained with high luminous efficiency and high stability; (2) providing a silicon carbide light emitting diode having a pn junction, which allows a multicolor display in a variety of display devices, as well as a faster and higher-density reading of information records in a variety of information processing units with light emitting diodes used as a light source; and (3) providing a silicon carbide light emitting diode having a pn junction, which can readily be mass-produced because of its conventional growth method for silicon carbide single crystals, so that various application fields of light emitting diodes are expanded rapidly.

BRIEF DESCRIPTION OF THE DRAWINGS

This invention may be better understood and its numerous objects and advantages will become apparent to those skilled in the art by reference to the accompanying drawings as follows:

FIG. 3 is a schematic sectional view showing a conventional silicon carbide light emitting diode having a pn junction.

DESCRIPTION OF THE PREFERRED EMBODIMENTS

The silicon carbide light emitting diode having a pn junction of this invention contains a luminescent center for controlling the luminescent process in addition to acceptors and donors for controlling the carrier concentration of the p-type layer and the n-type layer, respectively. These luminescent centers must not generate carriers which can affect the carrier concentration, and must have energy levels in which electrons or holes can be sufficiently trapped.

As a luminescent center which can be used in this invention, there can be mentioned a tetravalent transition element such as titanium (Ti), zirconium (Zr), and hafnium (Hf). A combination of these transition elements can also be used. The amount of these transition elements added is typically in the range of $1 \times 10^{15}$ to $1 \times 10^{19}$ cm$^{-3}$. The transition elements to be introduced as a luminescent center are added to at least one of the p-type layer and the n-type layer. These transition elements may be added to the entire region of the p-type layer and/or the n-type layer. Alternatively, these elements may be added to a partial region of the p-type layer and/or the n-type layer.

When introduced in an SiC crystal, the above-mentioned transition elements occupy lattice points of Si because of their atomic size. Since these transition elements exhibit a tetravalence similarly to Si and C, they can be bonded covalently to the surrounding carbon atoms without excess or deficiency of valence electrons. Therefore, there is no generation of carriers which can affect the carrier concentration or conductivity.

Since these transition elements have a d shell which is not completely filled with electrons, bonded covalently to the surrounding carbon atoms in a silicon carbide single crystal, they have energy levels in which electrons can be effectively trapped. When electrons are trapped in such energy levels, holes are then trapped by the Coulomb attraction of the electrons. The electrons and holes thus trapped perform radiative recombination. When any of the above-mentioned luminescent centers is used, the wavelength of light generated by the radiative recombination corresponds to visible light of a color in the range of from green to purple.

The silicon carbide light emitting diode having a pn junction of this invention has improved luminous efficiency. Light emission in high brightness is made possible by the introduction of a luminescent center capable of controlling the luminescent process independently of controlling the carrier concentration in the p-type layer and the n-type layer. Moreover, because the above-mentioned transition elements are used as the luminescent center, the color of emitted light in the range of from blue to purple can be obtained which has been difficult to achieve in practice so far.

The present invention will be further explained by reference to the following examples.

EXAMPLE 1

Figure 1:
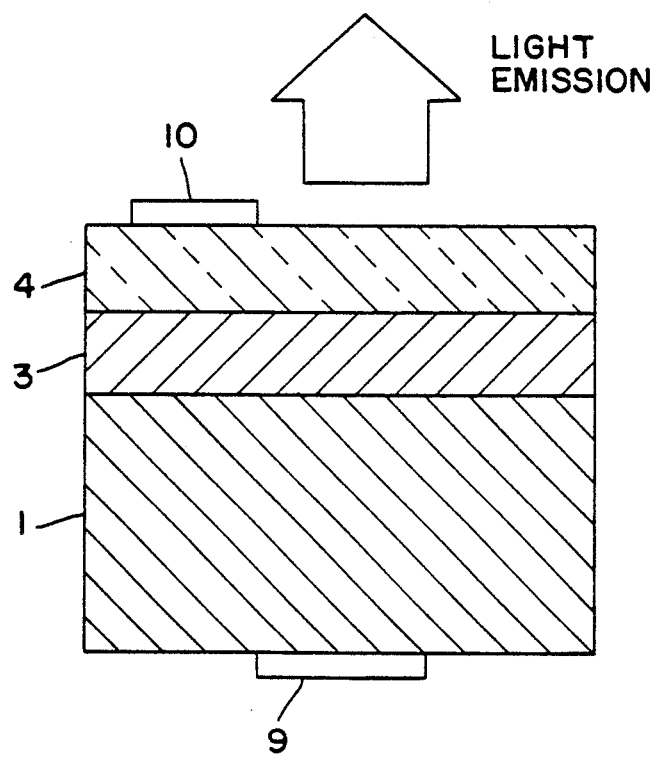
FIG. 1 is a schematic sectional view showing a silicon carbide light emitting diode having a pn junction of this invention.

FIG. 1 shows a silicon carbide light emitting diode having a pn-junction of this invention. The light emitting diode has a structure in which an N-doped n-type SiC single-crystal thin layer 3 and an Al-doped p-type SiC single-crystal thin layer 4, both of which constitute the pn junction, were successively formed on an N-doped n-type SiC single-crystal substrate 1. As a luminescent center, titanium (Ti) was added to both the n-type SiC single-crystal thin layer 3 and the p-type SiC single-crystal thin layer 4. For a method of forming the n-type SiC single-crystal thin layer 3 and the p-type SiC single-crystal thin layer 4, a liquid epitaxial growth (LPE) method was employed which has been commonly used to grow silicon carbide crystals. The LPE method is disclosed in, for example, M. Ikeda, T. Hayakawa, S. Yamagiwa, H. Matsunami, and T. Tanaka, Journal of Applied Physics, Vol. 50, No. 12, pp. 8215–8225 (1979).

First, the n-type SiC single-crystal thin layer 3 was grown on the n-type SiC single-crystal substrate 1 with the use of molten silicon containing an impurity of nitrogen. The thickness of the n-type SiC single-crystal thin layer 3 was 5 $\mu$m, and its carrier concentration was about $1 \times 10^{18}$ cm$^{-3}$. Then, the p-type SiC single-crystal thin layer 4 was grown on the n-type SiC single-crystal thin layer 3 with the use of molten silicon containing an impurity of aluminum. The thickness of the p-type SiC single-crystal thin layer 4 was 4 $\mu$m, and its carrier concentration was about $1 \times 10^{18}$ cm$^{-3}$. When growing the above SiC single-crystal thin layers, Ti was contained as the luminescent center in both the n-type SiC single-crystal thin layer 3 and the p-type SiC single-crystal thin layer 4 by the addition of metal titanium to the molten silicon.

Finally, an ohmic electrode 9 for n-type SiC was formed with nickel on the bottom surface of the n-type SiC single-crystal substrate I, and an ohmic electrode 10 for p-type SiC was formed with an Al-Si alloy on the upper surface of the p-type SiC single-crystal thin layer 4, resulting in a light emitting diode as shown in FIG. 1.

The silicon carbide light emitting diode obtained above emitted light mainly from the upper surface of the p-type SiC single-crystal thin layer 4, as shown in FIG. 1, by the application of a forward bias voltage. Under the operation conditions of 3.5 V and 20 mA, an intense bluish-purple light emission was obtained, the wavelength of the light emission peak being in the vicinity of 430 nm. Even when Ti was added as the luminescent center, the n-type SiC single-crystal thin layer 3 and the p-type SiC single-crystal thin layer 4 did not change in their electric characteristics. When the amount of titanium added to these SiC single-crystal thin layers was in the range of $1 \times 10^{15}$ to $1 \times 10^{19}$ cm$^{-3}$, light emission was observed. When the amount of titanium added exceeds $1 \times 10^{19}$ cm$^{-3}$, the degree of crystallization of the SiC thin layers was decreased, so that light emission was not observed. The silicon carbide light emitting diode of this example had the maximum luminous efficiency of 0.5%, indicating that luminous efficiency of the silicon carbide light emitting diode of this example was improved by a factor of 10 or more in comparison with conventional blue light emitting diodes.

EXAMPLE 2

Figure 2:
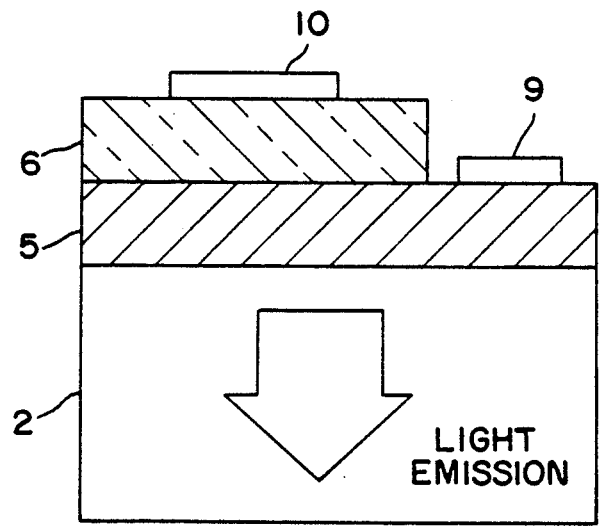
FIG. 2 is a schematic sectional view showing another silicon carbide light emitting diode having a pn junction of this invention.

FIG. 2 shows another silicon carbide light emitting diode having a pn junction of this invention. The light emitting diode has a structure in which an N-doped n-type SiC single-crystal thin layer 5 and an Al-doped p-type SiC single-crystal thin layer 6, both of which constitute the pn junction, were successively formed on an undoped high-resistive SiC single-crystal substrate 2. As a luminescent center, zirconium (Zr) was added to both the n-type SiC single-crystal thin layer 5 and the p-type SiC single-crystal thin layer 6. For a method of forming the n-type SiC single-crystal thin layer 5 and the p-type SiC single-crystal thin layer 6, a chemical vapor deposition (CVD) method was employed which has been commonly used to grow silicon carbide crystals. The CVD method is disclosed in, for example, S. Nishino, H. Suhara, H. Ono, and H. Matsunami, Journal of Applied Physics, Vol. 61, No. 10, pp. 4889-4893 (1987). As a material gas for growing silicon carbide single-crystals, a monosilane (SiH$_4$) gas and a propane (C$_3$H$_8$) gas were used. As a substrate, an undoped high-resistive SiC single-crystal substrate was used.

First, the n-type SiC single-crystal thin layer 5 was grown on the undoped high-resistive SiC single-crystal substrate 2 by the addition of a nitrogen (N$_2$) gas for doping to the above-mentioned material gases. The n-type SiC single-crystal thin layer 5 had a thickness of about 5 μm, and its carrier concentration was about $1 \times 10^{18}$ cm$^{-3}$. Then, the p-type SiC single-crystal thin layer 6 was grown on the n-type SiC single-crystal thin layer 5 by the use of a trimethyl aluminum (TMA) gas for Al doping instead of an N$_2$ gas. The p-type SiC single-crystal thin layer 6 had a thickness of about 4 μm, and its carrier concentration was about $1 \times 10^{18}$ cm$^{-3}$. When growing the above SiC single-crystal thin layers, Zr was contained as the luminescent center in both the n-type SiC single-crystal thin layer 5 and the p-type SiC single-crystal thin layer 6, by disposing metal zirconium in a reaction tube and heating it.

Finally, a part of the p-type SiC single-crystal thin layer 6 was removed by dry etching. On the n-type SiC single-crystal thin layer 5, an ohmic electrode 9 for n-type SiC was formed with nickel. On the p-type SiC single-crystal thin layer 6, an ohmic electrode 10 for p-type SiC was formed with an Al-Si alloy, resulting in a light emitting diode as shown in FIG. 2.

The silicon carbide light emitting diode obtained above emitted light mainly from the lower surface of the undoped high-resistive SiC single-crystal thin layer 2, as shown in FIG. 2, by the application of a forward bias voltage. In the light emitting diode of this example, light emission can be obtained from the substrate side, since a transparent undoped SiC single-crystal was used as the substrate. Under the operation conditions of 3.5 V and 20 mA, an intense blue light emission was obtained, the wavelength of the light emission peak being in the vicinity of 460 nm. When the amount of zirconium added to the above-mentioned SiC single-crystal thin layers was in the range of $1 \times 10^{15}$ to $1 \times 10^{19}$ cm$^{-3}$, light emission was observed. The silicon carbide light emitting diode of this example had a maximum luminous efficiency of 0.7%, indicating that the luminous efficiency of the silicon carbide light emitting diode of this example was improved by a factor of 10 or more in comparison with conventional blue light emitting diodes.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A silicon carbide light emitting diode having a pn junction, comprising a semiconductor substrate, a first silicon carbide single-crystal layer of one conductivity formed on said substrate, and a second silicon carbide single-crystal layer of the opposite conductivity formed on said first silicon carbide layer, said first and second silicon carbide layers constituting the pn junction, wherein at least one of said first and second silicon carbide layers contains a tetravalent transition element as a luminescent center.

2. A silicon carbide light emitting diode having a pn junction according to claim 1, wherein said tetravalent transition element is at least one selected from the group consisting of titanium (Ti), zirconium (Zr), and hafnium (Hf).

3. A silicon carbide light emitting diode having a pn junction according to claim 1, wherein the amount of said tetravalent transition element is in the range of $1 \times 10^{15}$ to $1 \times 10^{19}$ cm$^{-3}$.

* * * * *